Dec. 1, 1970 D. J. SHARP 3,544,287

HEAT TREATMENT OF MULTILAYERED THIN FILM STRUCTURES
EMPLOYING OXIDE PARTING LAYERS

Filed April 13, 1967

INVENTOR
D. J. SHARP
BY *Mann & Jangarathis*
ATTORNEYS

United States Patent Office 3,544,287

Patented Dec. 1, 1970

3,544,287

HEAT TREATMENT OF MULTILAYERED THIN FILM STRUCTURES EMPLOYING OXIDE PARTING LAYERS

Donald Jex Sharp, Princeton, N.J., assignor to Western Electric Company, Incorporated, New York, N.Y., a corporation of New York Filed Apr. 13, 1967, Ser. No. 630,688
Int. Cl. H01c 7/00, 17/00
U.S. Cl. 29—620 5 Claims

ABSTRACT OF THE DISCLOSURE

Multilayer thin film structures have heretofore been produced employing tantalum nitride for resistor components, metallic tantalum from which capacitors can be produced, with layers of aluminum, gold, etc., forming conductive leads. A preferred method of manufacture involves successive deposition on a substrate of $Ta_2N$, $Ta_2O_5$, Ta and Al or Au, followed by selective etching to form discrete components, the $Ta_2O_5$ layer serving as a parting or etch stop layer. Electrical connection of the $Ta_2N$ to the Ta layer through the $Ta_2O_5$ layer occurs because of penetration by high energy tantalum atoms during sputtering, but the connection is noisy and has substantial resistance. This problem has now been eliminated by a diffusion heat treatment after etching, which not only produces a low-noise, low-resistance connection, but also improves capacitor quality, improves overlay adhesion and allows for changes of resistance and temperature coefficient of resistor components.

BACKGROUND OF THE INVENTION

Field of the invention

This invention relates generally to the production of multilayer, integrated thin film R-C or R-C-L circuits and, more particularly, the invention relates to an improved method of securing low-noise, low-resistance contact through oxide parting or etch-stop layers sandwiched between the component layers.

Description of the prior art

In U.S. application Ser. No. 409,656 filed Nov. 9, 1964, of John W. Balde, assigned to the same assignee as the instant application, there is described a preferred method of producing coated substrates and multilayer thin film integrated circuits. Briefly, a plurality of equal area or full-surface films are deposited on a substrate in a one-pass, continuous in-line vacuum process. By not breaking the vacuum between deposition of the various layers, contamination problems are substantially eliminated. The coated substrates thus produced can be formed into a variety of circuit patterns by selective sequential etching employing photolithographic pattern shaping techniques.

Tantalum nitride is a desirable material for resistor paths because it provides resistances of high stability. Metallic tantalum and particularly the recently discovered beta tantalum are desirable for anodizing to form capacitor dielectrics, because they provide high capacitance densities. Beta tantalum is described in U.S. Pat. No. 3,275,916, issued Sept. 27, 1966 to A. J. Harendza-Harinxma, and assigned to the same assignee as the as the instant application. However, since tantalum and tantalum nitride are both attacked by similar etchants, the use of the continuous in-line vacuum deposition technique is not possible unless a parting or etch-stop layer is inserted therebetween. That is, without such an etch-stop layer, it is necessary either to follow the deposition of each layer with a selective etching step, or carry out the deposition of each layer in a specific pattern by using masks. Either method involves breaking the vacuum and performing intermediate steps, which introduced contamination and other problems. With a suitable parting or etch stop layer, that is, one which will protect the underlying layer while the overlying layer is selectively etched, the continuous in-line vacuum deposition of all layers can be carried out without interruption.

It has been determined that tantalum pentoxide is etched about 50 times slower than tantalum metal by the conventional hydrofluoric-nitric acid etching solution commonly employed to etch tantalum. This makes the pentoxide desirable as a parting or etch stop layer. Since a layer of tantalum pentoxide can be readily produced in continuous in-line equipment, it is clearly preferred. Also, tantalum pentoxide is rapidly attacked by hot concentrated sodium hydroxide, which reagent does not attack tantalum metal at an appreciable rate, at least below about 80° C. Thus, a system is available for sequential etching of a $Ta_2N$-$Ta_2O_5$-Ta-metal overlay sandwich which, by selection of etching reagents, can delineate resistors, capacitors, conductors, crossovers, etc. in any desired pattern.

Tantalum pentoxide is, of course, an insulator, and one would not ordinarily expect any conduction between the $Ta_2N$ and Ta layers through such a material. However, as pointed out in the above-noted copending application, the tantalum pentoxide layer can be very thin, about 750–1000 A. being sufficient to provide adequate protection during etching. Further, this thin oxide layer is penetrated by high energy tantalum atoms during sputtering of the latter, which provides conductive paths through the pentoxide layer. Lastly, it is noted in said application that the pentoxide need not be pure to still carry out its etch-stop or parting layer function, but can have more or less tantalum or tantalum nitride mixed therewith, with an appropriate effect on the conductive properties of the layer.

While the foregoing expedients do provide a certain level of conductivity, the $Ta_2O_5$ layer can be expected to have pin holes and other such defects which will cause intermittent noise and variations in conductivity beyond tunneling or Schottky current effects. This problem is illustrated by noise measurements made on eight 20,000 ohm resistors having 0.0058 in.$^2$ contact pads through a $Ta_2O_5$ layer of about 1000 A. thickness:

| Noise, db |
|---|
| —4 |
| 0 |
| +10 |
| —18 |
| —12 |
| —15 |
| —20 |
| —18 |

Such resistors are thus not suited for low-noise applications.

Heating has heretofore been proposed to bring about a redox reaction to make an electrical contact. In U.S. Pat. No. 3,106,489 of M. P. Lepselter, assigned to Bell Telephone Laboratories, Inc., the problem concerned making of contacts to polished silicon crystals without penetration into the diffused area. The solution proposed involves covering the surface to which contact is to be made with $SiO_2$, followed by deposition of an active metal capable of being oxidized and which metal has an appreciable solid solubility for its own oxide. The assembly is heated to bring about reduction of $SiO_2$ to Si and oxidation of the active metal. Since the newly formed oxide is soluble in the parent metal, it does not adversely affect conductivity. Titanium is preferred as the active metal.

SUMMARY OF THE INVENTION

It is a general object of the present invention to provide an improved method of making multilayered thin film structures.

Another object of the invention is to provide a method of treating integrated thin film R-C or R-C-L circuits during manufacture thereof whereby low-noise, low-resistance contacts are made between various circuit components.

Still another object of the invention is to provide an improved method of making multilayered thin film structures which exhibit low-noise, low-resistance contacts between various circuit components, better overlay adhesion and controllable temperature coefficient adjustments of resistive circuit components.

Various other objects and advantages of the invention will become clear from the following description of embodiments thereof, and the novel features will be particularly pointed out in connection with the appended claims.

In essence, the present invention resides in the use of a diffusion heat treatment after sequential etching to delineate the thin film circuit components. This has been found to have several beneficial effects, the most important of which is to reduce contact resistance and noise levels between the components. Thus, the oxide parting or etch stop layer is at least in part diffused into the adjoining tantalum nitride and tantalum layers. At the same time, pin holes or other noise-generating defects become unimportant current paths, because the whole layer is rendered conductive. Additional benefits of the diffusion heat treatment are that the adhesion of conducting overlays is improved, the heating eliminates the conventional back etching normally performed on $Ta_2O_5$ dielectrics, and effects temperature coefficient adjustment of the resistors.

BRIEF DESCRIPTION OF DRAWINGS

Understanding of the invention will be facilitated by referring to the following description of embodiments thereof in conjunction with the accompanying drawings, wherein.

DETAILED DESCRIPTION OF EMBODIMENTS

Figure 1:
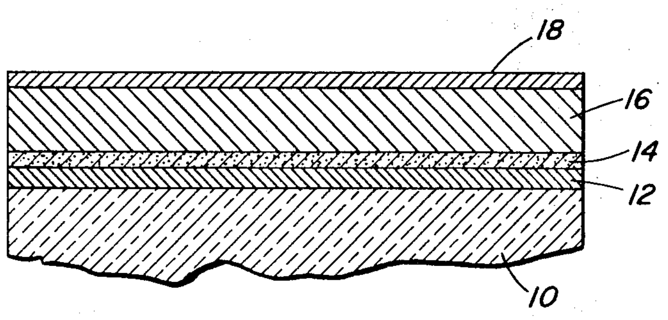
FIG. 1 is a cross-sectional elevation, greatly enlarged, of a coated substrate before any etching.

A coated substrate produced in a continuous, in-line vacuum deposition apparatus is illustrated in FIG. 1. A substrate 10 is initially provided, which may be a high-alumina ceramic, glass or the like. The first layer deposited thereon is a layer of tantalum nitride 12. This may initially be 1000–1500 A. thick, and in the next step a layer of tantalum pentoxide 14 is applied by reactive sputtering. Alternatively, the initial tantalum nitride layer 12 may be 1500–2000 A. thick, and the tantalum pentoxide layer can then be produced by anodizing. In either case, the tantalum pentoxide layer 14 is about 750 A. thick. Next, approximately 6000 A. of metallic tantalum 16, preferably beta tantalum, is deposited on the tantalum pentoxide layer 14. Lastly, a conductive layer 18 of aluminum or Nichrome-gold is applied. When the continuous, in-line apparatus is used, all of these layers are coextensive in area with the substrate.

In the case of an aluminum top layer 18, the composite structure is processed to form a thin-film integrated circuit as follows: Contact pads, leads, and capacitor areas are delineated by photo resist techniques, the remaining areas being etched to the $Ta_2O_5$ etch stop layer 14 in a conventional HF-nitric acid etching solution. Dilute NaOH may be used for a more rapid removal of the overlying aluminum layer followed by the HF-nitric etch described. As noted hereinabove, the $Ta_2O_5$ was found to etch approximately 50 times slower in a HF-nitric acid etch solution than an equivalent thickness of tantalum, so there is an adequate length of time to carry out this step without significant removal of tantalum pentoxide.

Figure 2:
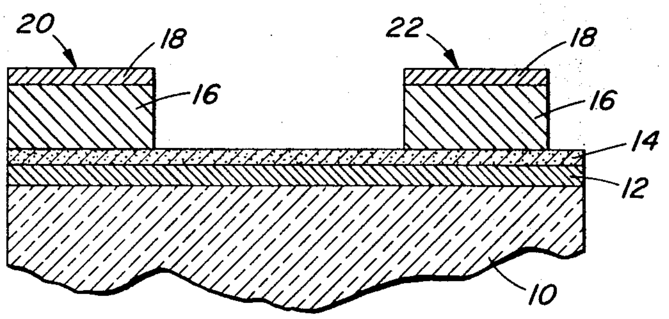
FIG. 2 is a cross-sectional elevation of the substrate of FIG. 1 after a portion of the etching operation is complete.
Figure 3:
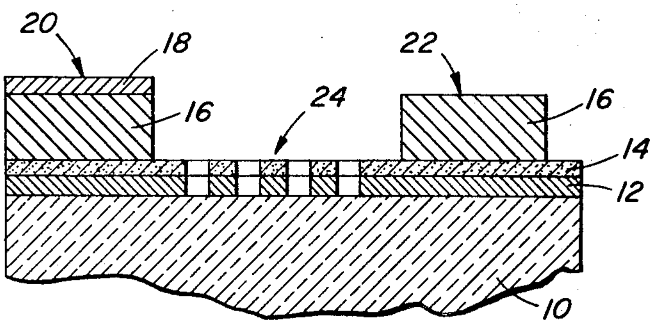
FIG. 3 is a cross-sectional elevation of a partially completed thin-film device.

At this point the delineated portions are surrounded by tantalum nitride protected by the remaining $Ta_2O_5$ layer, as shown in FIG. 2. As shown, a bonding pad 20 and capacitor electrode site 22 are delineated. The entire surface is then patterned with photo resist in such a way as to further delinete resistors terminating in appropriate locations having the earlier defined pads, capacitors, or conductive lines. It should be noted that the first photo resist coating need not be removed since it provides additional protection to the metal overlay. Hot 10 Normal NaOH (60° C.) is used to remove the $Ta_2O_5$ etch stop layer 14 and simultaneously pattern the resistors. The HF-nitric etching solution may be used as an alternative etchant for the $Ta_2N$ after removal of the $Ta_2O_5$ layer in NaOH, if desired. At this point, as shown in FIG. 3, resistor 24 has been provided (in a zig-zag pattern) which still bears the $Ta_2O_5$ etch stopping oxide. This eliminates the need of a separate resistor-protecting anodization step later in the process.

Thus, the alternative use of the HF-nitric and NaOH solutions allows selective etching to provide beta tantalum structures first and $Ta_2N$ resistor patterns second.

Areas which serve as conductors or pads retain the beta tantalum and aluminum; however, the remaining beta tantalum capacitor sites are stripped of the aluminum in dilute NaOH for subsequent anodization. The photo resist operation that defines the areas to be stripped of aluminum also localizes the anodization that forms the dielectrics for those areas.

FIG. 3 illustrates the circuit at this processing point. The structure is complete with the exception of finished capacitors, and the $Ta_2O_5$ layer which still remains and separates the contact from the resistor terminations to the overlying contact materials. The circuit is completed by forming the capacitor dielectrics by anodizing trim anodizing the resistor patterns, depositing counterelectrodes on the capacitors and depositing any required cross overs, as more fully described in the above-mentioned co-pending application. The heat treatment of the invention may be carried out at any point in the process prior to deposition of the counterelectrodes, but it is preferred that it be carried out after the dielectrics have been formed, because additional benefits are gained as discussed below.

As noted hereinabove, the $Ta_2O_5$ layer was responsible for noisy connection, and eight measurements were presented illustrating this. The same eight resistors were heated to 540° C. for twenty minutes, in accordance with the present invention, and noise measurements were again made. The results are presented below, with the original measurements also given for ease of comparison.

NOISE MEASUREMENTS OF 20,000 OHM RESISTORS .0058 IN.² CONTACT PADS

| Original noise, db: | Noise db (diffused at 540° C.—20 minutes |
|---|---|
| −4 | −37 |
| 0 | −45 |
| +10 | −45 |
| −18 | −42 |
| −12 | −44 |
| −15 | −45 |
| −20 | −35 |
| −18 | −37 |

Several theories have been proposed which regard agreement relates to the lack of understanding of the structure of the insulating dielectric. As noted above, the film can be expected to have pin holes and other defects which would provide alternative intermittent noise and represent variations of conductivity beyond tunneling or Schottky current effects. While not wishing to be bound to any particular theory, it is believed that the very significant reduction in noise levels brought about by the heat treatment of the invention is the result of providing such a large number of low-noise conducting paths through the film that the defects become trivial areas of conduction. The improvement shown by the present invention was observed repeatedly in the fabrication of similar circuits, and has been explored within the range of 370° C. to about 540° C., although the dissolution or diffusion of the $Ta_2O_5$ etch stop or parting layer can take place at lower temperatures. Diffusion temperatures of 300° C. for ½ hour in a similar test produced noise measurements of somewhat high magnitude, averaging −33 db as compared to the values shown above.

The contact resistance of the diffused multilayer of FIG. 3 was measured in a separate experiment and found to be reduced five-fold by the heat treatment, using a diffusion temperature of 370° C. for 20 minutes. Spreading resistance from the contacting probe undoubtedly provided some contribution to the measured values.

In the conventional production of tantalum thin film capacitors, the quality of the dielectric is improved by back-etching and reforming steps after the intial anodizing treatment. It has also been disclosed that a heat treatment followed by reforming to the original voltage has the same effect. By carrying out the heat treatment of the present invention after the capacitor dielectric areas have been formed, the need for a separate heating step is eliminated. Tests have confirmed that capacitors formed in this manner are of comparable quality to those produced by the conventional methods.

Two materials having been commonly used as the metal overlay, gold and aluminum. Aluminum may be evaporated directly over the beta tantalum for use in circuits which use ultrasonic bonds at their terminations. Circuits requiring soldering or attachment of beam lead devices may use the conventional Nichrome-gold overlay. In either case, the diffusion treatment of the present invention provides an additional benefit of excellent adhesion between layers. For example, 4000 A. of gold was evaporated onto a sputtered tantalum deposit. After a 20 minute heat treatment at 500° C., the gold could not be removed by pressing down adhesive tape and then pulling it up, and could be soldered. No intermediate coat or bonding agent was used in this case and the bond was between tantalum and gold directly. The gold does not exhibit sufficient adhesion prior to the diffusion heat treamtent to incorporate it by itself as a conductive overlay.

In a production process not employing in-line deposition, the heat treatment, in addition to providing better adhesion between the tantalum and the overlying contact pad, also significantly reduces the noise level and resistance of this connection. This is so because in the non-in-line deposition process, the tantalum is exposed to the atmosphere prior to deposition of the metal overlay, thereby resulting in the formation of a thin tantalum pentoxide film. The situation is thus similar to the layers above and below the $Ta_2O_5$ etch stop layer, and the heat treatment apparently diffuses oxygen atoms into the surrounding metal and metal atoms into the oxide layer.

It has been noted that the improvement in the contact between the tantalum (or tantalum nitride) and the overlying contact pad caused by the heat treatment is especially pronounced when the overlying contact pad is applied by electroless plating techniques. These techniques commonly involve treatment with a sensitizing solution, followed by eectroless deposition of nickel and gold layers. Many factors affect the noise of such connections, included amongst which are the composition and freshness of the sensitizing solution, length of sensitizing, and the like. It was found, however, that in each instance, heating for about 15 minutes in the aforesaid 300°–600° C. range, preferably 370° C.–540° C., significantly reduced both noise and resistance, and increased bond strength.

An additional observation of the finished resistor measurements points to the opportunity for adjusting both resistivity and the temperature coefficient of resistance. Temperatures near the upper range of those used in the heat treatment of the invention appear to be capable of producing temperature coefficient (T.C.) changes of considerable magnitude. As an example, a 1500 A. deposit of $Ta_2N$ having an initial T.C. of −151 p.p.m./° C. was changed to −239 p.p.m./° C. after 20 minutes at 540° C. The process of oxygen diffusion into the resistor body would appear to be responsible for this phenomenon, but may be somewhat complicated to explain on a more quantitative basis due to the nitrogen already in the resistor deposit. Similar effects were also observed with heat treatments at lower temperatures, i.e., 370° C. for 20 minutes, although the changes were correspondingly of a lower magnitude (15 p.p.m. negative change as compared with 88 p.p.m. at the higher temperature).

Resistor drift or oxidation during the heat treatment appear to depend closely on the stoichiometry of the original $Ta_2N$ deposit. Compositions of essentially exact $Ta_2N$ stoichiometry change by only one or two percent at the 370° C. diffusion temperature. Those varying from this desirable composition may change 10 to 15%. The more intense diffusion temperatures (540° C.) which produced considerable T.C. changes resulted in resistance increases of 25 to 30% in $Ta_2N$. Compositions deviating significantly from $Ta_2N$ changed as much as 60% or more. In these tests the anodic oxide parting layer provides some degree of oxidation protection to the resistors during the heat treatment. Under the conditions used for diffusion in this process, no appreciable additional oxide growth was observed, hence the overall change of resistance was attributed to interdiffusion of the $Ta_2N$ and the adjacent $Ta_2O_5$.

In summary, the higher temperature diffusion heat treatments are preferred except where resistance changes are to be minimized, and this is no problem if the $Ta_2N$ stoichiometry is carefully controlled. The lower limit of temperatures for the heat treament is merely that which will bring about the desired reactions in a reasonable time; in the work described this is about 300° C. The upper temperature limit is of course that which will cause any of the component parts to lose structural integrity (i.e. flow or liquefy), or cause excessive oxidation. Thus, when an aluminum overlay is present the heating should not go much above 600° C. Oxidation of resistors may also become severe above this temperature.

Various changes in the details, steps, materials and arrangements of parts, which have been herein described and illustrated in order to explain the nature of the invention, may be made by those skilled in the art wthin the principle and scope of the invention as defined in the appended claims.

What is claimed is:

1. In the manufacture of a thin-film integrated circuit on a substrate having in sequence from the substrate, a tantalum nitride resistor layer, a tantalum pentoxide etch-stop layer, a metallic tantalum capacitor electrode layer and a highly conductive layer, and wherein said layers are sequentially etched to delineate thin-film circuit components, the improvement comprising heating the etched assembly to a temperature in the range of about 300° C. to about 600° C. for a period sufficient to substanially reduce noise and contact resistance between said resistor layer and overlying layers.

2. The method of manufacturing thin-film integrated circuits suitable for low-noise applications from coated substrates having, in sequence from the substrate, a tantalum nitride resistor layer, a tantalum pentoxide etch stop layer, a metallic tantalum capacitor electrode layer and a highly conductive layer, the steps comprising:

sequentially etching the several layers to delineate thin-film resistive, capacitative and conductive circuit components;

heating the etched asembly to a temperature in the range of about 300° C. to about 600° C. for a period of from about 15 minutes to about one hour; and completing said circuit by forming dielectrics and counterelectrodes on said capacitor components and trim anodizing said resistor components.

3. The method of manufacturing thin-film integrated circuits suitable for low-noise applications from coated substrates having, in sequence from the substrate, a tantalum nitride resistor layer, a tantalum pentoxide etch stop layer, a metallic tantalum capacitor electrode layer and a highly conductive layer, the steps comprising:

sequentially etching the several layers to delineate thin film resistive, capacitative and conductive circuit components;

forming dielectrics and counterelectrodes on said capacitor components; and heating the assembly thus produced to a temperature in the range of about 300° C. to about 600° C. for a period of about 15 minutes to one hour, whereby low-resistance, low-noise contacts are made between said resistive components and overlying components, adhesion of said conductive components is improved, and the resistance and temperature coefficient of said resistive components is adjusted.

4. In the manufacture of thin-film integrated circuit elements having a layer of tantalum pentoxide between an underlying film of tantalum nitride and an overlying film of metallic tantalum, the improvement comprising heating said element to a temperature between about 300° C. and about 600° C. for less than about one hour, whereby a mechanically strong, low-resistance, low-noise contact is made between said respective films.

5. In the manufacture of thin-film integrated circuit elements having a layer of tantalum pentoxide between an underlying film of tantalum nitride and an overlying film of a highly conductive metal, the improvement comprising heating said element to a temperature between about 300° C. and about 600° C. for less than about one hour, whereby a mechanically strong, low-resistance, low-noise contact is made between said respective films.

References Cited

UNITED STATES PATENTS

| | | | |
|---|---|---|---|
| 3,159,556 | 12/1964 | McLean et al. | 204—37 |
| 3,386,011 | 5/1968 | Marray et al. | 29—620X |
| 3,406,043 | 10/1968 | Balde | 29—577X |

FOREIGN PATENTS

| | | |
|---|---|---|
| 655,852 | 1/1963 | Canada. |

JOHN F. CAMPBELL, Primary Examiner

R. B. LAZARUS, Assistant Examiner

U.S. Cl. X.R.

29—624, 625; 148—13; 204—37